(12) United States Patent
Riley

(10) Patent No.: US 7,721,168 B2
(45) Date of Patent: *May 18, 2010

(54) EFUSE PROGRAMMING DATA ALIGNMENT VERIFICATION

(75) Inventor: Mack W. Riley, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/202,584

(22) Filed: Sep. 2, 2008

(65) Prior Publication Data

US 2008/0320349 A1    Dec. 25, 2008

Related U.S. Application Data

(63) Continuation of application No. 11/289,109, filed on Nov. 29, 2005, now Pat. No. 7,434,127.

(51) Int. Cl.
*G01R 31/3181* (2006.01)
*G01R 31/316* (2006.01)

(52) U.S. Cl. .................... 714/724; 714/726

(58) Field of Classification Search ............ None
See application file for complete search history.

(56) References Cited

U.S. PATENT DOCUMENTS

| | | | |
|---|---|---|---|
| 5,083,293 A | 1/1992 | Gilberg et al. | 365/189.01 |
| 5,446,420 A | 8/1995 | Westwick | 331/179 |
| 5,923,835 A | 7/1999 | Sanghani et al. | 714/30 |
| 5,953,741 A | 9/1999 | Evoy et al. | 711/132 |
| 6,182,233 B1 | 1/2001 | Schuster et al. | 713/400 |
| 6,874,110 B1 | 3/2005 | Camarota | 714/733 |
| 7,200,064 B1 | 4/2007 | Boerstler et al. | 365/225.7 |
| 7,373,573 B2 | 5/2008 | Riley | 714/733 |
| 7,434,127 B2 * | 10/2008 | Riley | 714/726 |
| 2005/0050415 A1 | 3/2005 | Anand et al. | 714/726 |
| 2007/0081620 A1 | 4/2007 | Beattie et al. | 375/376 |

OTHER PUBLICATIONS

Cowan et al., "On-Chip Repair and an ATE Independent Fusing Methodology", IEEE, ITC International Test Conference, Paper 7.3, pp. 178-186, 2002.

* cited by examiner

*Primary Examiner*—Kevin L Ellis
*Assistant Examiner*—Dipakkumar Gandhi
(74) *Attorney, Agent, or Firm*—Francis Lammes; Stephen J. Walder, Jr.; Matthew B. Talpis

(57) ABSTRACT

An eFuse data alignment verification mechanism is provided. Alignment latches are provided in a series of latch units of a write scan chain and a logic unit is coupled to the alignment latches. A sequence of data that is scanned-into the series of latch units of the write scan chain preferably includes alignment data values. These alignment data values are placed in positions within the sequence of data that, if the sequence of data is properly scanned-into the series of latch units, cause the data values to be stored in the alignment latches. The logic unit receives data signals from the alignment latches and determines if the proper pattern of data values is stored in the alignment latches. If the proper pattern of data values is present in the alignment latches, then the data is aligned and a program enable signal is sent to the bank of eFuses.

17 Claims, 6 Drawing Sheets

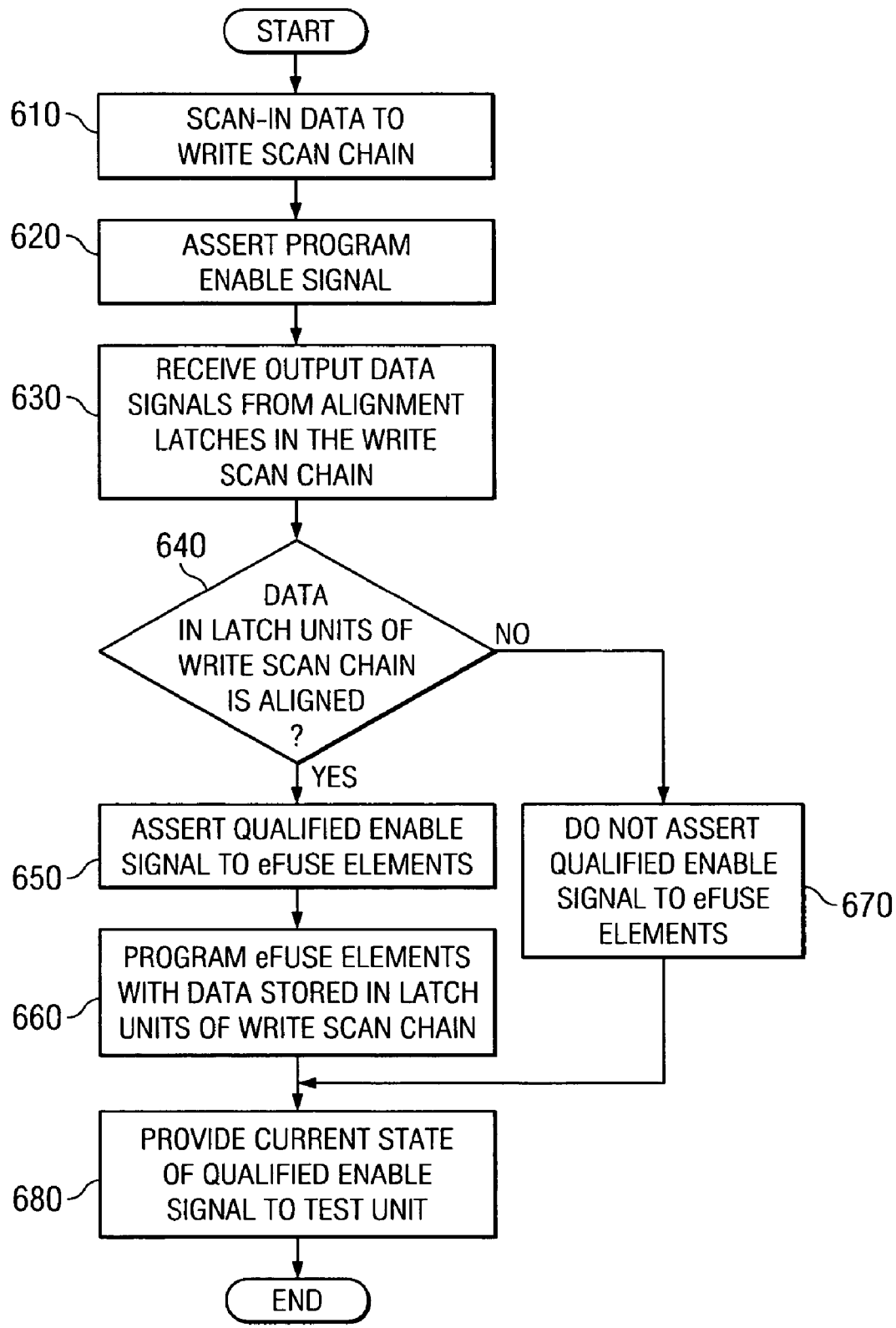

EFUSE PROGRAMMING DATA ALIGNMENT VERIFICATION

This application is a continuation of application Ser. No. 11/289,109, filed Nov. 29, 2005, status awaiting publication.

BACKGROUND OF THE INVENTION

1. Technical Field

The present application relates generally to an improved data processing system and method. More specifically, the present application is directed to an apparatus and method for verifying the alignment of data for programming a bank of electrically programmable fuses (eFuses).

2. Description of Related Art

An electrically programmable fuse (eFuse) is a simple circuit element that has one of two different states: blown or unblown. As is generally known in the art, the writing of data to eFuses involves the blowing of eFuses to represent a "1" and the leaving of eFuses in their default state, i.e. unblown, to represent a "0" value. In the unblown state, the eFuse enables an electrical contact while in the blown state, the electrical contact is severed. However, the opposite approach may be taken in the case of, for example, inverse eFuses in which blowing of the eFuse actually enables an electrical contact thereby representing a "0" with the default state representing a "1."

Many integrated circuit chips available from International Business Machines, Inc., already include one or more banks of eFuses that are used to provide a self-repair ability to the integrated circuit chip. With eFuses, if an imperfection is detected in the integrated circuit, the appropriate eFuses are tripped, i.e. blown. The activated fuses help the chip control individual circuit speed to manage power consumption and repair unexpected, and potentially costly, flaws. If the technology detects that the chip is malfunctioning because individual circuits are running too fast or too slow, it can "throttle down" these circuits or speed them up by controlling appropriate local voltage. The eFuses are provided in the integrated circuit chips with little if any additional cost to the integrated circuit chips.

FIG. 1 is a diagram of an eFuse in accordance with a known structure. As shown in FIG. 1, the eFuse element 100 consists of several components including a polysilicon fuse 110, a fuse latch 120, a program latch 130, a program field effect transistor (FET) 140, and a look-ahead programming multiplexer 150. The first, and primary component is the polysilicon fuse 110. The fuse 110 has two possible logic states. In the depicted example, it can remain intact where its value is evaluated as a logical "zero." The other state is "programmed" and evaluates to a logical "one." A DC current pulse of approximately 10 mA in amplitude and duration of 200 μsec is required to program the fuse 110. This high current programs the fuse 110 by dynamically increasing the resistance of the polysilicon link.

A fuse latch 120 is associated with each fuse 110. The fuse latch 120 serves three functions: (1) during fuse programming, all fuse latches 120 are initialized to a logical "zero," and then a single logical "one" is shifted through, providing a sequence enabling mechanism to determine when to program each fuse 110; (2) when reading the fuse values, the fuse latch 120 is used to sense and store the fuse value; and (3) the fuse latch has an additional data port, used to create a daisy chain between all fuses, which permits serial access to all fuses. Because of the high DC current requirements required to program a single fuse, a logical "one" is shifted through a field of zeros using the daisy chained state latches in order to program one fuse at a time.

The remaining components of the eFuse 100 are functional only when programming the fuse 110. The desired state of the fuse is shifted into the program latch 130. When a program latch 130 is loaded with a logical "one," it selects the program FET 140 and also disables the look-ahead programming multiplexer 150. The look-ahead programming multiplexer 150 causes the fuse latch's shifted "one" to skip over fuses which are not selected for programming, thereby saving fuse programming time.

For programming to occur, the EFuseProg signal is enabled and a high voltage is places across the fuse 110 using the FSource input and the resulting current is sunk through the program FET 140. Only when this high current path is enabled can the fuse be programmed. The program FET 140 is enabled when the program latch 130 is set and the shifted "one" arrives at the fuse latch 120. For more information regarding eFuses and the use of eFuses to perform on-chip repair, reference is made to Cowan et al., "On-Chip Repair and an ATE Independent Fusing Methodology," ITC International Test Conference, IEEE 2002, pages 178-186, which is hereby incorporated by reference.

As can be seen from the above eFuse description, once an eFuse is programmed, in general it cannot be re-programmed. Thus, it is extremely important to ensure that the data that is used to program a bank of eFuses is the correct data before programming the bank of eFuses. With current circuitry, it is possible that when data is being shifted into the program latches of the bank of eFuses, that one or more data values may be shifted improperly due to timing differences in circuit elements. As a result, the data in the program latches may be misaligned.

If the data is misaligned, then incorrect data will be programmed into the bank of eFuses. Since the eFuses cannot be re-programmed, such an error may cause the integrated circuit device in which the bank of eFuses is situated to not function properly. Furthermore, it may be quite costly to attempt to repair the integrated circuit device or such repair may not even be possible and the integrated circuit device must be discarded.

SUMMARY OF THE INVENTION

The illustrative embodiments provide mechanisms for ensuring alignment of data for programming of a bank of electrically programmable fuses (eFuses). The illustrative embodiments comprise one or more alignment latches provided in a series of latch units of a write scan chain and a logic unit coupled to the one or more alignment latches. Preferably, the one or more alignment latches are placed between latch units of the series of latch units at appropriate positions to ensure that the scanning-in of data into the series of latch units is performed in an aligned manner.

The sequence of data that is scanned-into the series of latch units of the write scan chain preferably includes alignment data values. These alignment data values are placed in positions within the sequence of data that, if the sequence of data is properly scanned-into the series of latch units, cause the data values to be stored in the one or more alignment latches. If the sequence of data is not properly scanned-in and a misalignment of data occurs, then the data values stored in the one or more alignment latches will not match the pattern of alignment data values originally placed in the sequence of data.

The logic unit receives data signals from the one or more alignment latches and determines if the proper pattern of data values is stored in the alignment latches. If the proper pattern of data values is not present in the alignment latches, then a misalignment of the scanned-in data is determined to be present. If the proper pattern of data values is present in the alignment latches, then the scanned-in data is determined to be aligned.

Depending upon the results of the determination and whether a program enable signal is asserted by a test unit, the logic unit may assert or not assert a qualified program enable signal to the eFuse elements of the bank of eFuses. Only when the qualified program enable signal is asserted to the eFuse elements are they programmed using the data values stored in the latch units. Thus, only when the proper alignment data values are stored in the alignment latches and the program enable signal is asserted by the test unit will the eFuses elements of the bank of eFuses be programmed. In this way, programming of the bank of eFuses with misaligned data is avoided.

In one illustrative embodiment, an apparatus is provided, on an integrated circuit device, for writing data to a plurality of storage devices. The apparatus may comprise a plurality of storage devices, a series of latch units arranged as a scan chain and coupled to the plurality of storage devices, one or more alignment latches arranged in the series of latch units, and a logic unit coupled to the one or more alignment latches. The plurality of storage devices may be electrically programmable fuse (eFuse) units having one or more eFuses.

A sequence of data may be scanned into the series of latch units and the one or more alignment latches in the series of latch units. The logic unit may determine whether the sequence of data is correctly scanned into the series of latch units based on data values stored in the one or more alignment latches. The data scanned into the series of latch units may be written to the plurality of storage devices if the logic unit determines that the sequence of data is correctly scanned into the series of latch units.

Each storage device in the plurality of storage devices may receive, as input, a qualified program enable signal from the logic unit and a data input from a latch, in the series of latch units, coupled to the storage device. The storage device may be programmed with the data received via the data input from the latch, in the series of latch units, coupled to the storage device, in response to the qualified program enable signal being asserted from the logic unit to the storage device. The qualified program enable signal may be asserted from the logic unit to the storage device if the logic unit determines that the sequence of data is correctly scanned into the series of latch units based on data values stored in the one or more alignment latches. The logic unit may assert the qualified program enable signal in response to the logic unit recognizing a predetermined pattern of data values from the one or more alignment latches.

The logic unit may be an AND gate, or other logic gate, for example. The AND gate may receive, as inputs, the data values from each of the one or more alignment latches and an enable signal from a testing device. The AND gate may output a qualified enable signal to the plurality of storage devices based on the inputs to the AND gate. The AND gate may further provide the qualified enable signal as an output to the testing device to inform the testing device as to whether the sequence of data scanned into the series of latches was scanned-in correctly.

In an embodiment where the storage devices are eFuse units, each eFuse unit may comprise 64 eFuses, for example.

In such an embodiment, a portion of the sequence of data written to each eFuse unit may be a 64 bit portion of the sequence of data.

The apparatus may be part of a test unit on a system-on-a-chip. The system-on-a-chip may be a heterogeneous processor system-on-a-chip having a master processor and at least one co-processor, and wherein the master processor and at least one co-processor have different instruction sets. The sequence of data may be a sequence of data for testing the functionality of units in the system-on-a-chip.

In another illustrative embodiment, a method, in a data processing device, for writing data to a plurality of storage devices is provided. The method may comprise scanning a sequence of data into a series of latch units, coupled to the plurality of storage devices, and one or more alignment latches in the series of latch units. The method may further comprise determining whether the sequence of data is correctly scanned into the series of latch units based on data values stored in the one or more alignment latches and writing the data scanned into the series of latch units to the plurality of storage devices if it is determined that the sequence of data is correctly scanned into the series of latch units. The plurality of storage devices may be electrically programmable fuse (eFuse) units having one or more eFuses.

The writing of the data scanned into the series of latch units to the plurality of storage devices may comprise asserting a qualified program enable signal, and a data input signal from a latch in the series of latch units coupled to a storage device, to the storage device in response to a determination that the sequence of data is correctly scanned into the series of latch units. The qualified program enable signal may be asserted in response to a logic unit recognizing a predetermined pattern of data values from the one or more alignment latches.

The logic unit may be an AND gate, or other logic gate, for example. The AND gate may receive, as inputs, the data values from each of the one or more alignment latches and an enable signal from a testing device. The AND gate may output a qualified enable signal to the plurality of storage devices based on the inputs to the AND gate.

The method may further comprise providing an output to a testing device indicating whether or not the sequence of data scanned into the series of latches was scanned-in correctly.

The method may be implemented in a test unit on a system-on-a-chip. The system-on-a-chip may be a heterogeneous processor system-on-a-chip having a master processor and at least one co-processor, and wherein the master processor and at least one co-processor have different instruction sets.

These and other features and advantages of the present invention will be described in, or will become apparent to those of ordinary skill in the art in view of, the following detailed description of the preferred embodiments.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 6 is a flowchart outlining an exemplary operation for aligning data for programming a bank of eFuses in accordance with one illustrative embodiment.

DETAILED DESCRIPTION OF THE PREFERRED EMBODIMENT

Figure 1:
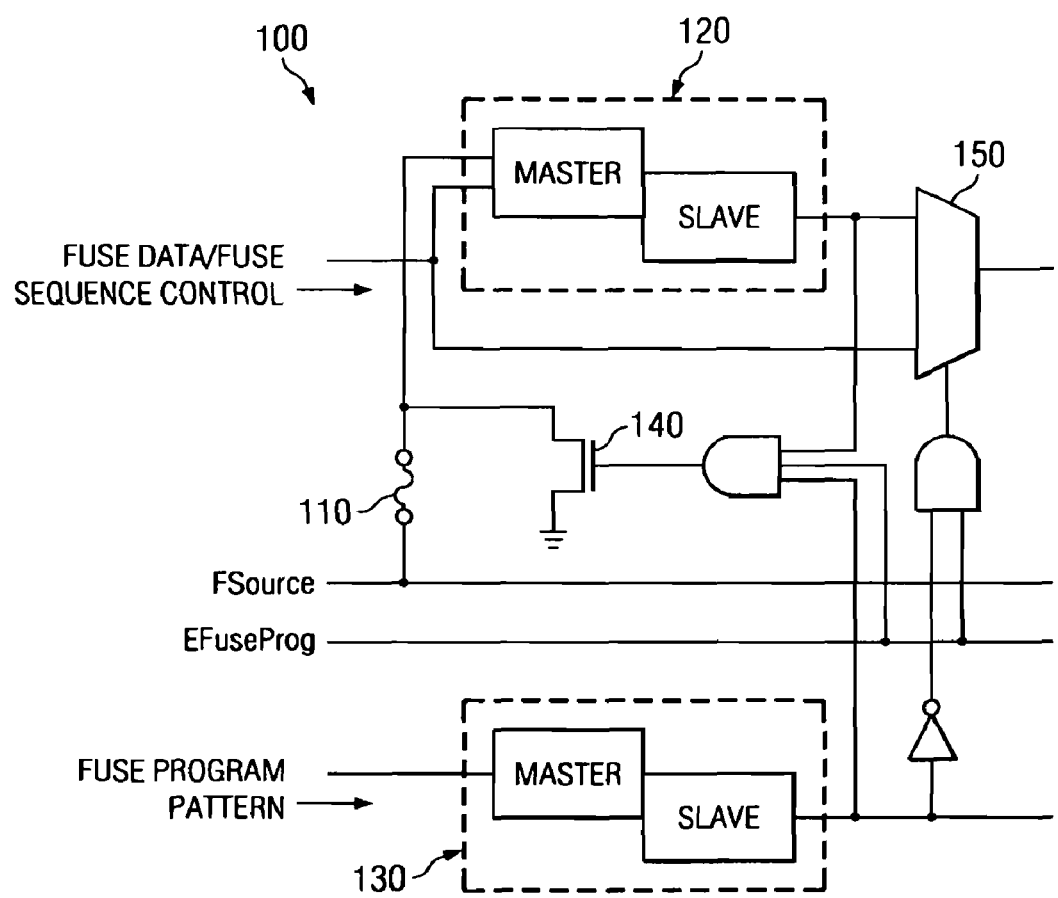
FIG. 1 is a diagram of an eFuse in accordance with a known structure.
Figure 2:
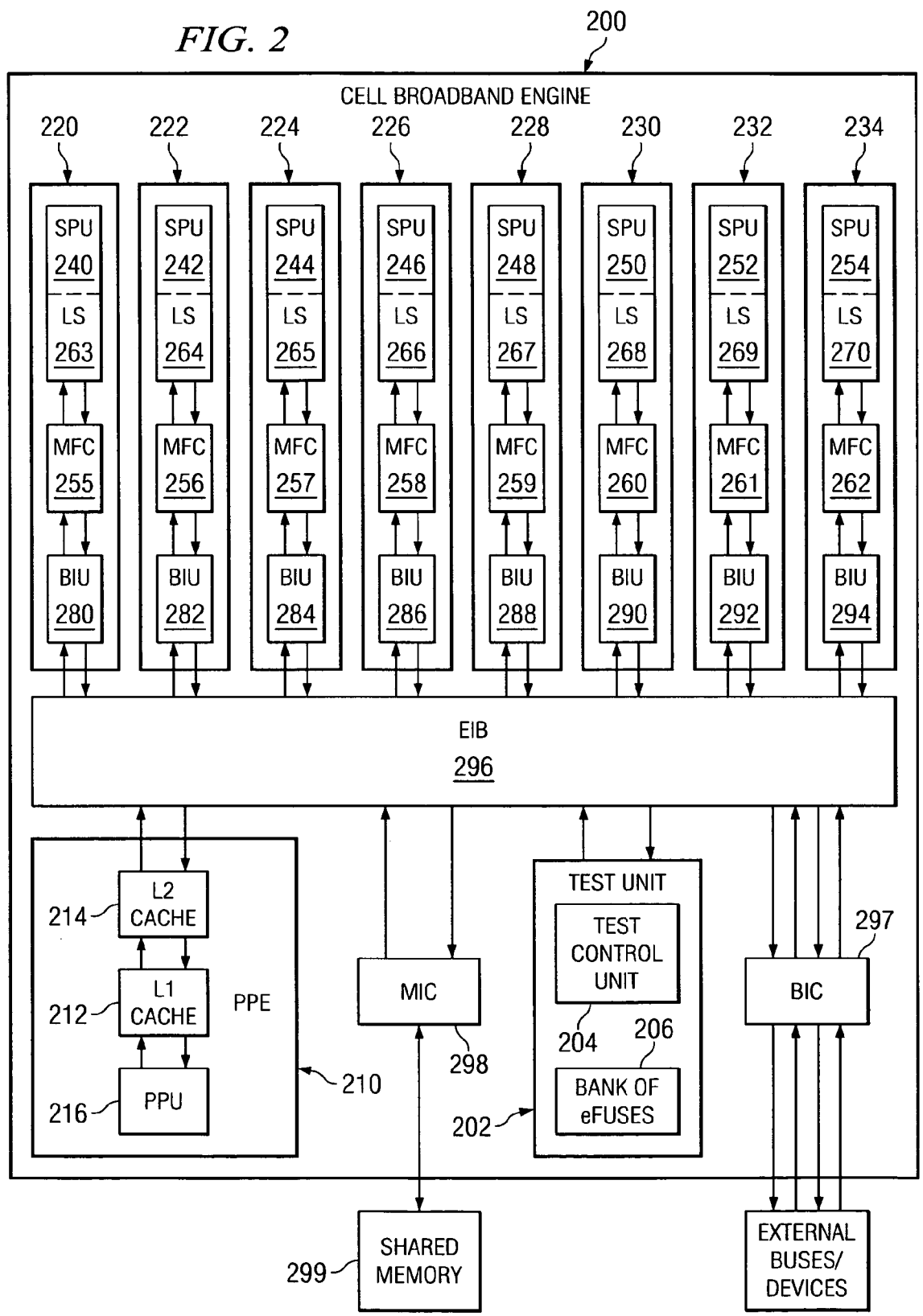
FIG. 2 is an exemplary diagram illustrating a data processing system in which exemplary aspects of the illustrative embodiments may be implemented.

As mentioned above, the illustrative embodiments are directed to an apparatus and method for aligning data to be programmed into a bank of electric fuses (eFuses). The illustrative embodiments may be used with any apparatus in which an array of eFuses is used to store data. Such apparatus may take the form of an integrated circuit device, a microprocessor, system-on-a-chip, or the like, for example. FIG. 2, hereafter, provides one example microprocessor system-on-a-chip in which the exemplary aspects of the illustrative embodiments may be implemented. While it will be assumed for purposes of this description that the bank of eFuses is provided in such a system-on-a-chip, it should be appreciated that the depicted system-on-a-chip is only exemplary and the present invention is not limited to such an embodiment.

FIG. 2 is an exemplary block diagram of a data processing system in which aspects of the present invention may be implemented. The exemplary data processing system shown in FIG. 2 is an example of the Cell Broadband Engine (CBE) data processing system. While the CBE will be used in the description of the preferred embodiments of the present invention, the present invention is not limited to such, as will be readily apparent to those of ordinary skill in the art upon reading the following description.

As shown in FIG. 2, the CBE 200 includes a power processor element (PPE) 210 having a processor (PPU) 216 and its L1 and L2 caches 212 and 214, and multiple synergistic processor elements (SPEs) 220-234 that each has its own synergistic processor unit (SPU) 240-254, memory flow control 255-262, local memory or store (LS) 263-270, and bus interface unit (BIU unit) 280-294 which may be, for example, a combination direct memory access (DMA), memory management unit (MMU), and bus interface unit. A high bandwidth internal element interconnect bus (EIB) 296, a bus interface controller (BIC) 297, and a memory interface controller (MIC) 298 are also provided.

The CBE 200 may be a system-on-a-chip such that each of the elements depicted in FIG. 2 may be provided on a single microprocessor chip. Moreover, the CBE 200 is a heterogeneous processing environment in which each of the SPUs may receive different instructions from each of the other SPUs in the system. Moreover, the instruction set for the SPUs may be different from that of the PPU, e.g., the PPU may execute Reduced Instruction Set Computer (RISC) based instructions while the SPU execute vectorized instructions.

The SPEs 220-234 are coupled to each other and to the L2 cache 214 via the EIB 296. In addition, the SPEs 220-234 are coupled to MIC 298 and BIC 297 via the EIB 296. The MIC 298 provides a communication interface to shared memory 299. The BIC 297 provides a communication interface between the CBE 200 and other external buses and devices.

The PPE 210 is a dual threaded PPE 210. The combination of this dual threaded PPE 210 and the eight SPEs 220-234 makes the CBE 100 capable of handling 10 simultaneous threads and over 128 outstanding memory requests. The PPE 210 acts as a controller for the other eight SPEs 220-234 which handle most of the computational workload. The PPE 210 may be used to run conventional operating systems while the SPEs 220-234 perform vectorized floating point code execution, for example.

The SPEs 220-234 comprise a synergistic processing unit (SPU) 240-254, memory flow control units 255-262, local memory or store 263-270, and an interface unit 280-294. The local memory or store 263-270, in one exemplary embodiment, comprises a 256 KB instruction and data memory which is visible to the PPE 210 and can be addressed directly by software.

The PPE 210 may load the SPEs 220-234 with small programs or threads, chaining the SPEs together to handle each step in a complex operation. For example, a set-top box incorporating the CBE 200 may load programs for reading a DVD, video and audio decoding, and display, and the data would be passed off from SPE to SPE until it finally ended up on the output display. At 4 GHz, each SPE 220-234 gives a theoretical 32 GFLOPS of performance with the PPE 210 having a similar level of performance.

The memory flow control units (MFCs) 255-262 serve as an interface for an SPU to the rest of the system and other elements. The MFCs 255-262 provide the primary mechanism for data transfer, protection, and synchronization between main storage and the local storages 263-270. There is logically an MFC for each SPU in a processor. Some implementations can share resources of a single MFC between multiple SPUs. In such a case, all the facilities and commands defined for the MFC must appear independent to software for each SPU. The effects of sharing an MFC are limited to implementation-dependent facilities and commands.

The CBE 200 further includes a test unit 202 having a test control unit 204 and one or more banks of eFuses 206 for storing data to be used in performing tests of the functional units of the CBE 200. Test program data is shifted into latches associated with the one or more banks of eFuses 206 and is then used to burn-in the test program data into the one or more banks of eFuses 106. As is generally known in the art, an eFuse is a simple circuit element that has one of two different states: blown or unblown. As is generally known in the art, the writing of data to eFuses involves the blowing of eFuses to represent a "1" and the leaving of eFuses in their default state, i.e. unblown, to represent a "0" value. In the unblown state, the eFuse enables an electrical contact while in the blown state, the electrical contact is severed. However, the opposite approach may be taken in the case of, for example, inverse eFuses in which blowing of the eFuse actually enables an electrical contact thereby representing a "0" with the default state represents a "1."

Figure 3:
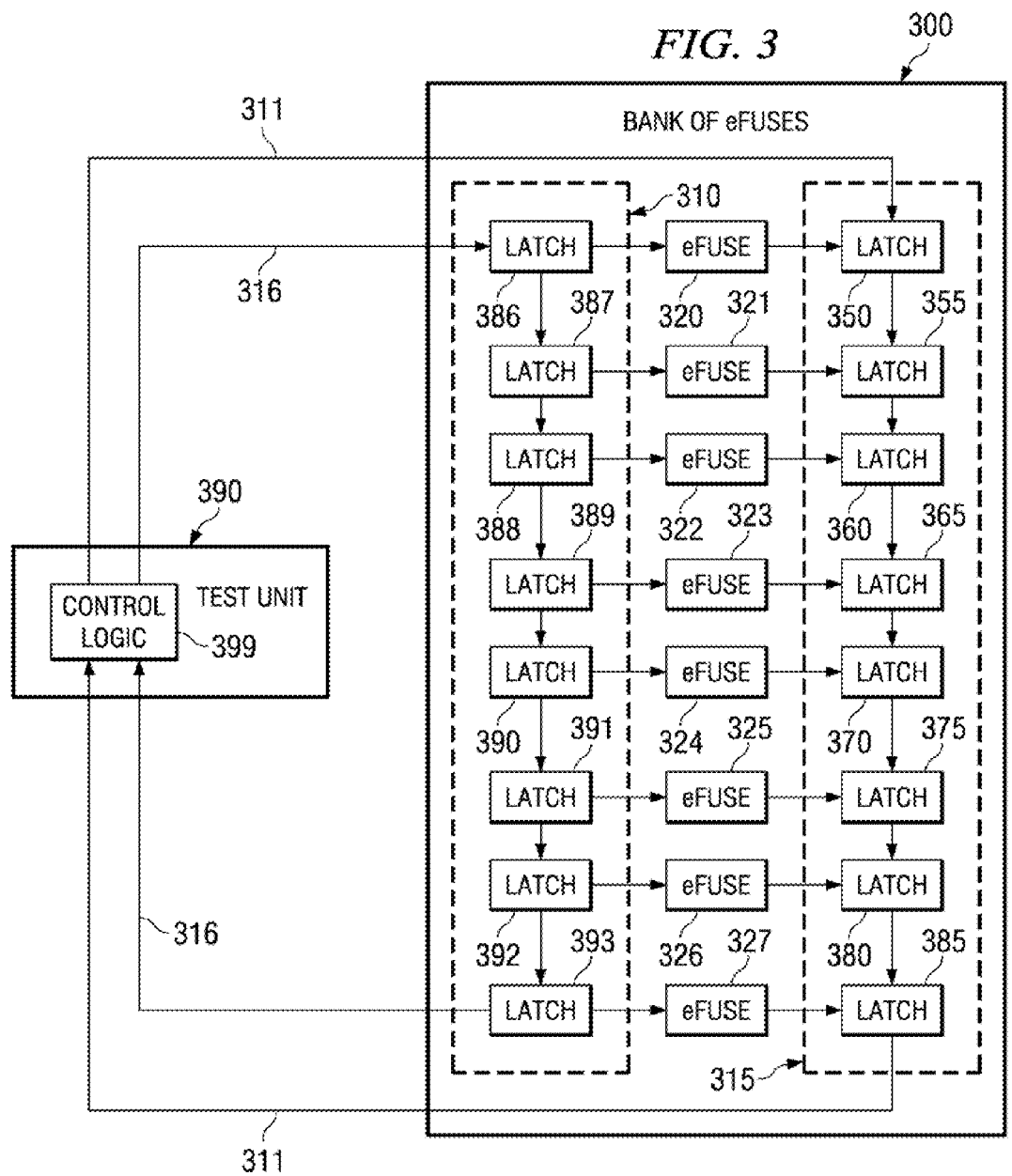
FIG. 3 is an exemplary block diagram of a test unit that may be provided as part of the data processing system of FIG. 2.

FIG. 3 is an exemplary block diagram of a test unit having a bank of eFuses that may be provided as part of the data processing system of FIG. 2. As shown in FIG. 3, the bank of eFuses 300 includes a write scan chain 310 and a read scan chain 315 for writing data to, and reading data from, the eFuse elements 320-327. The write scan chain 310 may be programmed by data shifted into the write latch units 386-393 from latch unit 386 down to latch unit 393. Data scanned into latch unit 386 is shifted down to latch unit 387 at a next clocking of the latch units 386-393 and data shifted into latch unit 387 is shifted down to latch 388 at the following clocking of the latch units 386-393, and so on.

Once the necessary data is shifted into the latch units 386-393 of the write scan chain 310, this data may be used to program the corresponding eFuse elements 320-327. For example, the data value stored in latch unit 389 is used to program the eFuse element 323 by either blowing or not blowing selective ones of the eFuses in the eFuse element 323. The data that is written to the eFuse elements 320-327 may be later used in testing functional units of the system-on-a-chip, microprocessor, or the like.

The eFuse elements 320-327 may comprise a plurality of eFuses which are individually programmed based on the data values stored in the latch units 386-393. In one illustrative embodiment, the latch units 386-393 may provide a 64 bit value to their corresponding eFuse elements 320-327 and each eFuse element 320-327 may comprise an array of 64 eFuses that are either blown or not blown depending upon whether their corresponding bit obtained from the latch unit is either a "1" or a "0."

The data that is written to the latch units 386-393 and subsequently to the eFuse elements 320-327 may be provided by control logic 399 of a test unit 390. This test unit 390 may be the on-chip test unit 202, for example, or a testing computing device that is external to the system-on-a-chip or microprocessor in which the bank of eFuses 300 is provided. The control logic 399 provides the data via a write scan chain input line 316.

In addition, the control logic 399 may read data from the bank of eFuses 300 by way of the read scan chain line 311. The latch units 350-385 of the read scan chain 315 may be used to read the currently programmed state data of the eFuse elements 320-327 and provide this data to the control logic 399. For example, the control logic 399 may require data stored in eFuse element 324 and may send an appropriate enable signal down the read scan chain 315 to latch unit 370 such that latch 370 captures an output of the eFuse element 324 and passes the output data down the read scan chain 315 to latch unit 385 which outputs the data to the control logic 399 via the read scan chain line 311.

The actual data written to and read from the bank of eFuses 300, in one illustrative embodiment, may represent any type of data that is useful in testing the functionality of units in the system-on-a-chip or microprocessor, e.g., redundancy data, configuration data, or the like. For example, the illustrative embodiments may be used with eFuses that store redundancy data used for testing functional units, such as is described in commonly assigned and co-pending U.S. patent application Ser. No. 11/146,988 entitled "Apparatus and Method for Using a Single Bank of eFuses to Successively Store Testing Data from Multiple Stages of Testing," filed on Jun. 6, 2005.

Alternatively, the illustrative embodiments may be used with a bank of eFuses that store non-testing related data, such as configuration data for one or more functional units. For example the illustrative embodiments may be used with a bank of eFuses that stores Phased-Lock-Loop (PLL) configuration data such as is described in commonly assigned and co-pending U.S. patent application Ser. No. 11/245,308 entitled "Apparatus and Method for Using eFuses to Store PLL Configuration Data," filed on Oct. 6, 2005. Moreover, the illustrative embodiments may be used with reprogrammable eFuses, such as those described in commonly assigned and co-pending U.S. patent application Ser. No. 11/246,586 entitled "Apparatus and Method for Providing a Reprogrammable Electrically Programmable Fuse," filed on Oct. 7, 2005. Each of these commonly assigned and co-pending U.S. Patent Applications are hereby incorporated by reference in their entirety.

Figure 4:
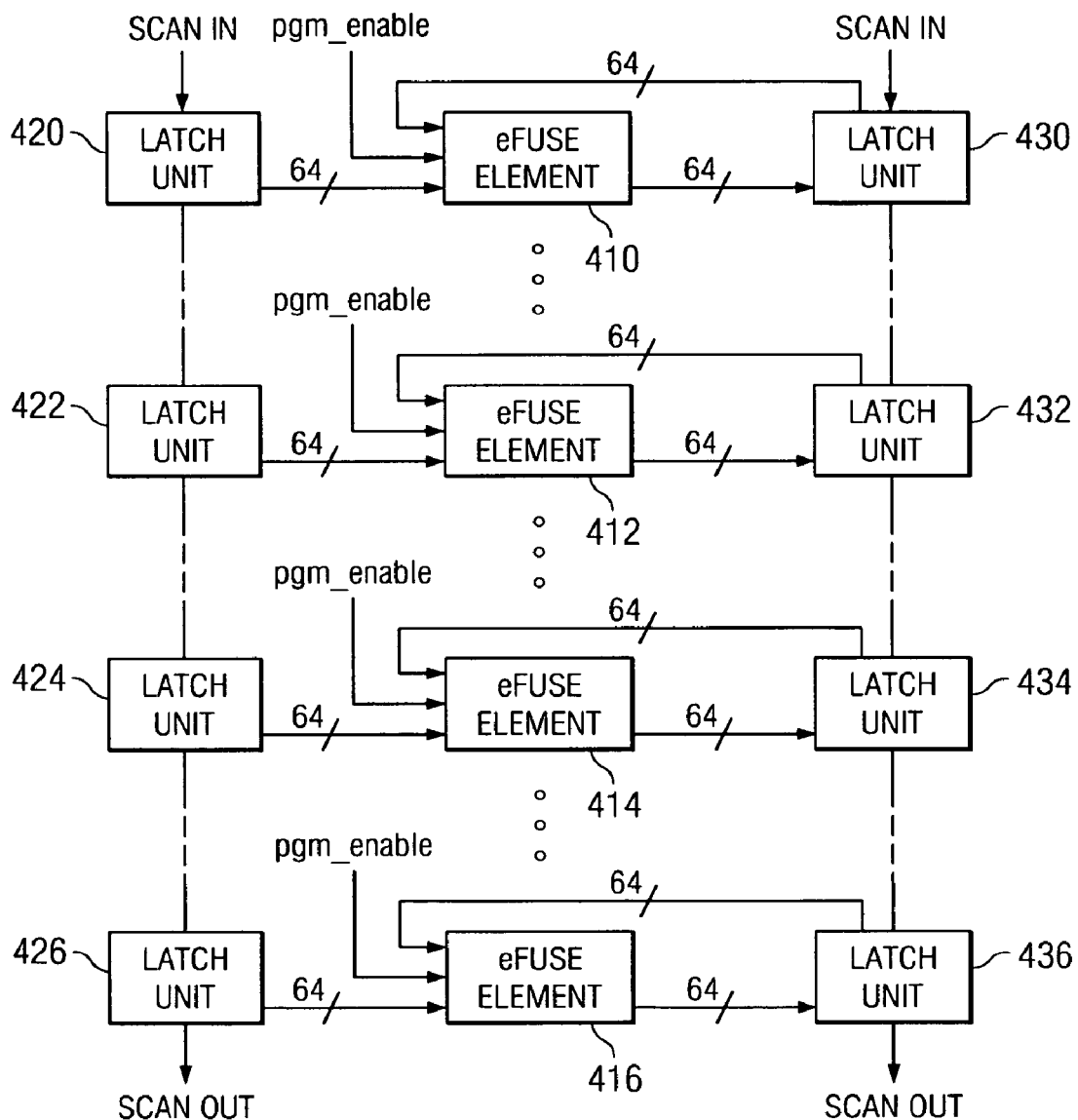
FIG. 4 is an exemplary diagram illustrating in greater detail the bank of eFuses which may be provided in the test unit of FIG. 3.

FIG. 4 is an exemplary diagram illustrating in greater detail the bank of eFuses which may be provided in the test unit of FIG. 3. As shown in FIG. 4, each of the eFuse elements 410-416 receive as inputs, the output from a corresponding write scan chain latch unit 420-426, a program enable signal (pgm_enable) from the test unit, and a program enable/data capture signal from a corresponding read scan chain latch unit 430-436. In order to write data output from a write scan chain latch unit, e.g., write scan chain latch 420, to the corresponding eFuse element, e.g., eFuse element 410, the eFuse element 410 must receive the program enable signal from the test unit and the program enable signal from the read scan chain latch unit 430. Essentially, the program enable signal from the test unit indicates that the shifting of data into the latch units 420-426 has been completed and the program enable signal from the read scan chain latch unit 430 indicates that the eFuses in the eFuse element 410 are ready to be programmed.

Each of the program enable signals from the read scan chain latch units 430-436 are sequentially enabled such that the eFuse elements 410-416 are written to sequentially. That is, the program enable signal from the read scan chain latch unit 430 is first enabled, then the program enable signal from the read scan chain latch unit 432, and so on, until all of the eFuse elements 410-416 are programmed. The eFuses are programmed sequentially to reduce the amount of current needed. It is possible to program them all in parallel, however, a very robust power distribution would be needed for the eFuses. Such a robust power distribution is typically avoided in order to make the circuit as simple as possible. For example, if one had 2000 eFuses and it took 10 mA to program each one, one would need a power delivery infrastructure on the chip that would deliver 20 Amps, which is undesirable for eFuses whose overhead is to be kept as low as possible.

These program enable signals are essentially AND'd in the eFuse elements 410-416 to determine whether individual eFuses in the eFuse elements 410-416 are to be programmed with corresponding input data values from the latch units 420-426. If both program enable signals for a particular eFuse in the eFuse element 410-416 are high, for example, then the eFuse is programmed with a corresponding bit from the output of the latch unit 420-426.

With regard to reading of data from the eFuse elements 410-416, read operations may be performed in parallel from the eFuse elements 410-416. Selective ones of the read scan chain latch units 430-436 may be read, for example, by using a common sense input signal (not shown) that goes to all eFuse blocks. When the sense input signal is asserted, the stored eFuse data will be place on the output of the eFuse block 410-416. This data is then latched in the read data latches 430-436. Once the data is captured in latches 430-436 it can be scanned or taken off the parallel output of the latch.

Alignment of the data that is shifted into the write scan chain latch units 420-426 is of great importance to proper functioning and use of the bank of eFuses, whether it be for testing purposes, configuration purposes, or other purposes. By "alignment" what is meant is the assurance that data values are at their proper location following a shift operation.

Typically, data is scanned, i.e. shifted, into the latch units 420-426 serially based on clocking of the latch units 420-426. A problem may arise in that the serial scanning-in may be off by one or more bits due to a misalignment of signals. For example, if a clocking signal or data signal's timing is off a different data value than was intended, e.g., a "0" instead of a "1," may be inadvertently stored in a latch unit 420-426. This single erroneous bit may cause the entire set of data stored in the latch units 420-426 to be invalid. Magnify this problem by the fact that a typical bank of eFuses may encompass many hundreds or thousands of eFuse elements and latch elements, and the seriousness of a slight misalignment can be clearly appreciated. Add to this the notion that eFuses, once programmed by burning-in or blowing the eFuses, are generally permanently encoded with the data that is burned-in, and the problem becomes even more drastic. Even in the case of the reprogrammable eFuse referenced above (U.S. patent application Ser. No. 11/246,586), such re-programmability is limited and scanning or shifting-in incorrect data to the bank of eFuses further limits the re-programmability of the eFuses by needlessly wasting an opportunity to program the bank of eFuses.

The illustrative embodiments provide a mechanism for ensuring the alignment of data that is scanned-into, or shifted-into, the bank of eFuse elements 410-416. The illustrative embodiments add to the arrangement shown in FIG. 4, a plurality of alignment latches in the write scan chain that are used to ensure that the data stored in the latch units 420-426 is aligned properly. These alignment latches are coupled to a logic unit of test control logic, for example, that operates on the output from these alignment latches to determine if the data scanned-into or shifted-into the latch units 420-426 was properly scanned or shifted-in. Based on this determination, a qualified program enable signal may be asserted or not asserted to the eFuse elements 410-416. This qualified program enable signal may also be provided as an output of the test control logic to an external testing computing device to inform the test control program whether the alignment is correct or not.

Figure 5:
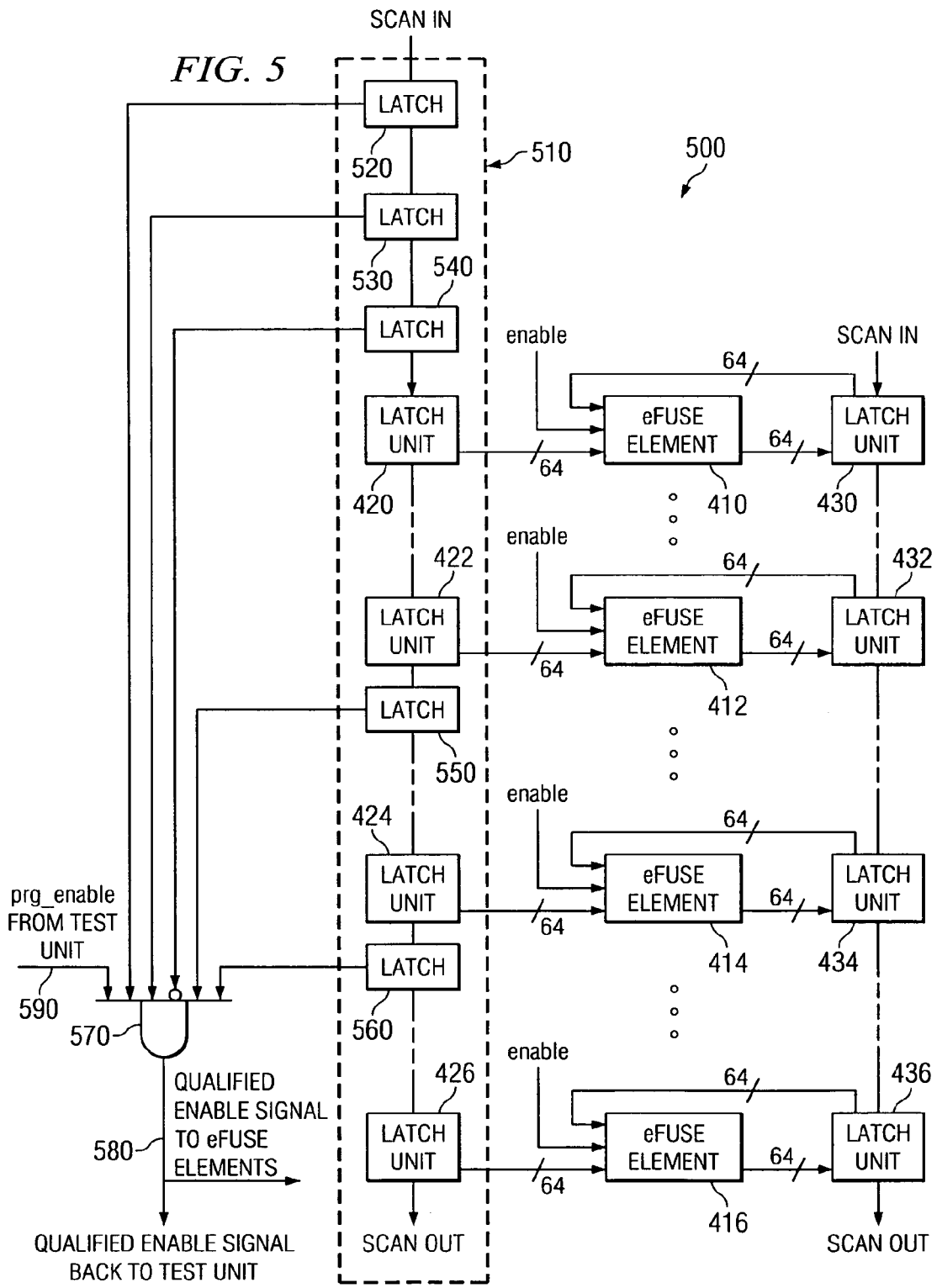
FIG. 5 is an exemplary diagram illustrating a bank of eFuses having alignment latches in accordance with one illustrative embodiment.

FIG. 5 is an exemplary diagram illustrating a bank of eFuses having alignment latches in accordance with one illustrative embodiment. As shown in FIG. 5, the arrangement of the bank of eFuses 500 is essentially the same as shown in FIG. 4 with the addition of alignment latches 520-560 in the write scan chain 510 and the additional logic unit 570 coupled to the alignment latches 520-560. The alignment latches 520-560 capture data values in a similar manner as the latches in the latch units 420-426 as data is scanned-into or shifted-into the write scan chain 510. Preferably, the data that is scanned-into the write scan chain 510 is pre-configured to have alignment data values positioned in the sequence of data to be scanned-in at locations that correspond to the alignment latches 520-560 once the sequence of data is completely scanned in.

Thus, for example, a sequence of data may comprise 2000 bits of data that is scanned into the latch units 420-426 with an additional 5 bits of alignment data inserted in the sequence of data at proper locations such that when the sequence of data is serially scanned into the write scan chain 510, the alignment data will reside in the alignment latches 520-560 if the data is properly scanned in with no misalignments.

The alignment data that is inserted into the sequence of data that is to program the latch units 420-426 forms a pattern of data that is recognized by the logic unit 570 as representing properly aligned data. For example, the pattern of data may be "11111," "10101," "11101," or the like. Essentially, the logic unit 570 has a particular pattern of alignment data that it expects to see as output from the alignment latches 520-560 if the sequence of data that was scanned-into the write scan chain latch units 420-426 was scanned-in properly. If the combination of outputs from the alignment latches 520-560 matches this pattern, then a qualified program enable signal 580 is asserted to the eFuse elements 410-416 to enable programming of these eFuse elements. If the combination of outputs from the alignment latches 520-560 does not match this pattern, then the qualified program enable signal 580 is not asserted and programming of the eFuse elements 410-416 is not enabled. In this way, misaligned data in the write scan chain latch units 420-426 may be identified and programming of the eFuse elements 410-416 with incorrect or mis-aligned data is avoided.

In the depicted example, the logic unit 570 is an AND gate that AND's the outputs from the alignment latches 520-560 with each other and a program enable signal from a test unit 590 to generate a single output, i.e. the qualified program enable signal 580. Thus, all inputs to the AND gate must be high, i.e. "1," in order for the qualified program enable signal 580 to be asserted. In other words, all of the alignment latches 520-560, with the exception of alignment latch 540, must store a "1" value in order for the AND gate to determine that the data scanned-into the write scan chain latch units 420-426 is properly aligned. The value stored in alignment latch 540 must be a "0" value, since it is inverted at the input to the AND gate. Thus, the pattern of alignment latch values that is recognized as being associated with aligned data in the write scan chain is "11011." Any other pattern is determined to be the result of a misalignment of the data being scanned into the write scan chain.

As can be seen from the above, if during scanning-in of the data to the latch units 420-426 a clocking of a latch unit does not align with an correct value of a data signal, then a wrong data value will be captured by the latch unit. For example, if the data value is to be a "1," and the clocking of the latch unit does not align with the assertion of the data signal, then a "0" may be written to the latch unit inadvertently. This incorrect data value will be propagated down the write scan chain and the mis-alignment will continue to occur with subsequent data values being scanned into the write scan chain. As a result, the pattern of data values stored in the alignment latches 520-560 will not be what is expected by the logic unit 570 for aligned data.

In addition to the outputs from the alignment latches 520-560, the AND gate receives a program enable input signal from a test unit. Only when the program enable input signal is asserted and the pattern of output signals described above is output by the alignment latches 520-560 to the AND gate, will the AND gate assert the qualified program enable signal 580. This qualified program enable signal 580 may be output to the eFuse elements 510-516 in order to enable programming of the eFuses in the eFuse elements 510-516. In addition, the qualified program enable signal 580 may be output to the test unit as feedback to identify problems, if any, with the scanning-in of data to the write scan chain. The feedback qualified program enable signal may be used by the test unit to generate a notification to a user of a problem with the testing of the system-on-a-chip, microprocessor, or the like.

It should be appreciated that while the depicted example makes use of an AND gate as the logic unit 570, the present invention is not limited to such. Rather, other logic gates, combinations of logic gates, combinations of other types of logic units, and the like, may be used to determine whether the data values output from alignment latches 520-560 are representative of aligned or misaligned data in the latch units 420-426 of the write scan chain.

Thus, the illustrative embodiments provide mechanisms for ensuring the proper alignment of data in a write scan chain that is used to write data to eFuse elements. The illustrative embodiments provide alignment latches and a logic unit that determines whether the data scanned-into the write scan chain for programming of the eFuse elements is aligned or not. Only when the data values stored in the alignment latches are indicative of aligned data in the write scan chain and a program enable signal is asserted by a test unit are the eFuse elements actually programmed.

FIG. 6 is a flowchart outlining an exemplary operation for aligning data for programming a bank of eFuses in accordance with one illustrative embodiment. It should be appreciated that the operations described in FIG. 6 may be performed in an integrated circuit device, such as a system-on-a-chip, a microprocessor, or the like. Moreover, while a particular sequence of steps is shown in FIG. 6, the illustrative embodiments are not limited to the particular sequence depicted. Rather, steps in the flowchart of FIG. 6 may be performed in different orders and in parallel with other steps of the flowchart without departing from the spirit and scope of the present invention.

As shown in FIG. 6, the operation starts by the test unit serially scanning-in a sequence of data to a write scan chain associated with a bank of eFuses that are to be programmed with the sequence of data (step 610). The sequence of data has a pattern of alignment data values inserted therein at appropriate positions in the sequence such that when the complete sequence of data is properly scanned-in to the write scan chain, the pattern of alignment data values are stored in alignment latches provided in the write scan chain.

The test unit then asserts a program enable signal to a logic unit that determines whether a qualified program enable signal is to be output to eFuse elements of the bank of eFuses (step 620). The logic unit receives as inputs, the output signals corresponding to the data values stored in the alignment latches of the write scan chain (step 630). The logic unit determines, based on the data values stored in the alignment latches whether the data scanned-into the write scan chain is aligned or misaligned (step 640). If the data is aligned, and the test unit asserts the program enable signal, then the qualified program enable signal is asserted to the eFuse elements of the bank of eFuses (step 650). The assertion of the qualified program enable signal to the eFuse elements causes the eFuses in the eFuse elements to be programmed using the data values stored in the latch units of the write scan chain (step 660). If the data is misaligned, then the qualified program enable signal is not asserted (step 670). The current state, i.e. asserted or not asserted, of the qualified program enable signal may also be provided to the test unit for use in informing a user of any problems associated with configuring the bank of eFuses or if the configuration has been performed correctly (step 680). The operation then terminates.

Thus, the illustrative embodiments provide mechanisms for ensuring the alignment of data prior to this data being permanently written to eFuses of an integrated circuit device. The illustrative embodiment aid is reducing the likelihood that a bank of eFuses is programmed with corrupted data and must be replaced or the integrated circuit device discarded. As a result, the illustrative embodiments reduce the costs associated with the programming of eFuses in integrated circuit devices.

As discussed above, the circuit as described above may be part of the design for an integrated circuit chip. The chip design may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. An apparatus, on an integrated circuit device, for writing data to a plurality of storage devices, comprising:
    a plurality of storage devices;
    a series of latch units arranged as a scan chain and coupled to the plurality of storage devices;
    one or more alignment latches arranged in the series of latch units; and
    a logic unit coupled to the one or more alignment latches, wherein:
        a sequence of data is scanned into the series of latch units and the one or more alignment latches in the series of latch units,
        the logic unit determines whether the sequence of data is correctly scanned into the series of latch units based on data values stored in the one or more alignment latches, and
        the data scanned into the series of latch units is written to the plurality of storage devices if the logic unit determines that the sequence of data is correctly scanned into the series of latch units, wherein each storage device in the plurality of storage devices receives, as input, a qualified program enable signal from the logic unit, and wherein the qualified program enable signal is asserted from the logic unit to the storage device if the logic unit determines that the sequence of data is correctly scanned into the series of latch units based on data values stored in the one or more alignment latches.

2. The apparatus of claim 1, wherein the plurality of storage devices are electrically programmable fuse (eFuse) units having one or more eFuses.

3. The apparatus of claim 2, wherein each eFuse unit comprises 64 eFuses, and wherein a portion of the sequence of data written to each eFuse unit is a 64 bit portion of the sequence of data.

4. The apparatus of claim 1, wherein each storage device in the plurality of storage devices receives a data input from a latch, in the series of latch units, coupled to the storage device.

5. The apparatus of claim 4, wherein the storage device is programmed with the data received via the data input from the latch, in the series of latch units, coupled to the storage device, in response to the qualified program enable signal being asserted from the logic unit to the storage device.

6. The apparatus of claim 1, wherein the logic unit is an AND gate, and wherein the AND gate receives as inputs the data values from each of the one or more alignment latches and an enable signal from a testing device, and outputs a qualified enable signal to the plurality of storage devices based on the inputs to the AND gate.

7. The apparatus of claim 6, wherein the AND gate further provides the qualified enable signal as an output to the testing device to inform the testing device as to whether the sequence of data scanned into the series of latches was scanned-in correctly.

8. The apparatus of claim 1, wherein the apparatus is part of a test unit on a system-on-a-chip.

9. The apparatus of claim 8, wherein the system-on-a-chip is a heterogeneous processor system-on-a-chip having a master processor and at least one co-processor, and wherein the master processor and at least one co-processor have different instruction sets.

10. The apparatus of claim 8, wherein the sequence of data is a sequence of data for testing the functionality of units in the system-on-a-chip.

11. A method, in a data processing device, for writing data to a plurality of storage devices, comprising:
scanning a sequence of data into a series of latch units, coupled to the plurality of storage devices, and one or more alignment latches in the series of latch units;
determining whether the sequence of data is correctly scanned into the series of latch units based on data values stored in the one or more alignment latches; and
writing the data scanned into the series of latch units to the plurality of storage devices if it is determined that the sequence of data is correctly scanned into the series of latch units, wherein writing the data scanned into the series of latch units to the plurality of storage devices comprises asserting a qualified program enable signal to the storage device in response to a determination that the sequence of data is correctly scanned into the series of latch units, and wherein the qualified program enable signal is asserted in response to a logic unit recognizing a predetermined pattern of data values from the one or more alignment latches.

12. The method of claim 11, wherein the plurality of storage devices are electrically programmable fuse (eFuse) units having one or more eFuses.

13. The method of claim 11, wherein writing the data scanned into the series of latch units to the plurality of storage devices comprises asserting a data input signal, from a latch in the series of latch units coupled to a storage device, to the storage device in response to a determination that the sequence of data is correctly scanned into the series of latch units.

14. The method of claim 11, wherein the logic unit is an AND gate, and wherein the AND gate receives as inputs the data values from each of the one or more alignment latches and an enable signal from a testing device, and outputs a qualified enable signal to the plurality of storage devices based on the inputs to the AND gate.

15. The method of claim 11, further comprising providing an output to a testing device indicating whether or not the sequence of data scanned into the series of latches was scanned-in correctly.

16. The method of claim 11, wherein the method is implemented in a test unit on a system-on-a-chip.

17. The method of claim 16, wherein the system-on-a-chip is a heterogeneous processor system-on-a-chip having a master processor and at least one co-processor, and wherein the master processor and at least one co-processor have different instruction sets.

* * * * *